United States Patent [19]

Owen

[11] Patent Number: 4,543,542
[45] Date of Patent: Sep. 24, 1985

[54] PHASE LOCKED LOOP FREQUENCY AND PHASE MODULATORS

[75] Inventor: David P. Owen, Dunstable, England

[73] Assignee: Marconi Instruments Limited, St. Albans, England

[21] Appl. No.: 607,397

[22] Filed: May 3, 1984

[30] Foreign Application Priority Data

May 17, 1983 [GB] United Kingdom ............. 8313616
Apr. 18, 1984 [GB] United Kingdom ............. 8410060

[51] Int. Cl.⁴ .......................... H03C 3/09; H03L 7/18
[52] U.S. Cl. ........................................ 332/18; 332/19; 332/23 R; 455/112; 455/119; 331/23
[58] Field of Search ................. 332/19, 18, 23 R; 455/112, 113, 119, 110, 42; 331/23

[56] References Cited

U.S. PATENT DOCUMENTS 4,308,508 12/1981 Sommer et al. .................... 332/18

FOREIGN PATENT DOCUMENTS 56-117405 9/1981 Japan .................................. 332/19
WO81/03250 11/1981 PCT Int'l Appl. ................. 332/18
1491899 11/1977 United Kingdom .
1560233 1/1980 United Kingdom .
2046541 11/1980 United Kingdom .

Primary Examiner—Siegfried H. Grimm
Attorney, Agent, or Firm—Spencer & Frank

[57] ABSTRACT

A signal generator is arranged to produce frequency or phase modulation at frequencies which extend from a high value down to zero, i.e. to a d.c. level shift. The output oscillator forms part of a phase locked loop which also includes a variable frequency divider. A modulation signal is applied to the loop, so that high frequency modulation signals directly modify the control signal which determines the frequency of the oscillator, and so that low frequency modulation signals alter the divisor value of the variable frequency divider so as to modify the frequency characteristics of the phase locked loop. Quantization noise is reduced by applying a masking signal to an analogue-to-digital converter which utilizes the low frequency modulation signals to alter the divisor value.

13 Claims, 3 Drawing Figures

PHASE LOCKED LOOP FREQUENCY AND PHASE MODULATORS

IMPROVEMENTS IN OR RELATING TO SIGNAL GENERATORS

This invention relates to signal generators which produce an electrical output signal at a controllable or predetermined mean frequency carrying an adjustable frequency modulation or phase modulation. Generators of frequency modulated signals are not uncommon, but it has proved difficult to provide such a generator which can accurately give a required high quality modulation at very low modulation frequencies, and most such signal generators cannot provide frequency modulation at modulation frequencies extending down to zero frequency.

Many sources of electrical signals include a voltage controlled oscillator arranged such that the level of an applied control signal determines its frequency, and commonly the oscillator forms part of a phase locked loop which determines the mean frequency of oscillation. Frequency modulation can be imparted to the frequency of oscillation, provided that the frequency of the modulation falls outside the bandwidth of the phase locked loop. If a modulation signal having frequency components lower than this bandwidth is applied to the phase locked loop, it operates to modify the effect of the modulation and if the modulation signal is merely a d.c. level shift (i.e. a zero frequency modulation which represents simply a shift in the carrier value) the output signal does not maintain the required frequency, but tends to revert to the frequency to which the phase locked loop is tuned. Phase modulation can be regarded simply as being the differential of frequency modulation. If a phase modulator is inserted inside a phase locked loop the phase modulation is only transferred to the oscillator at frequencies inside the loop bandwidth.

The present invention seeks to provide a signal generator which is capable of generating high quality frequency modulation or phase modulation at frequencies which extend from high frequencies down to zero, i.e. to d.c. coupled control signal levels.

According to a first aspect of this invention a modulation signal source includes a phase locked loop having a variable frequency oscillator; a variable frequency divider and a dual input phase detector, the frequency of said oscillator being dependent upon the value of a control signal derived from said phase detector; a source of reference frequency signals, the phase detector being operative to compare the frequency of a signal received from said oscillator via said divider with the frequency of a signal derived from the source of reference frequency signals; means for receiving a modulation signal and for utilising it to adjust said control signal; digital means responsive to said modulation signal to vary the divisor value of said frequency divider; and means for also feeding a masking signal to said digital means so as to reduce the effect of digital quantisation noise on the frequency characteristic of the phase locked loop, whereby the output signal of said oscillator is modulated in accordance with said modulation signal.

According to a second aspect of this invention a modulation signal source includes a phase locked loop having a variable frequency oscillator; a variable frequency divider, a dual input phase detector and a low pass filter, the frequency of said oscillator being dependent upon the value of a control signal derived from said phase detector and fed to it via said low pass filter; a source of reference frequency signals, the phase detector being operative to compare the frequency of a signal received from said oscillator via said divider with the frequency of a signal derived from the source of reference frequency signals; means for receiving a modulation signal and for utilising it to adjust said control signal; analogue-to-digital conversion means responsive to said modulation signal to vary the divisor value of said frequency divider; and means for producing at said conversion means a masking signal having a frequency below that of said reference frequency signals and above that of the cut-off value of said low pass filter, whereby the output signal of said oscillator is modulated in accordance with said modulation signal.

Preferably said means is a signal generator which itself generates the required masking frequency, but if the generator generates a signal having a frequency above that of the conversion speed of the analogue-to-digital conversion means, the process of digital conversion will down convert the frequency into the required band of the masking signal.

The invention is further described by way of example, with reference to the accompanying drawings in which.

Figure 1:
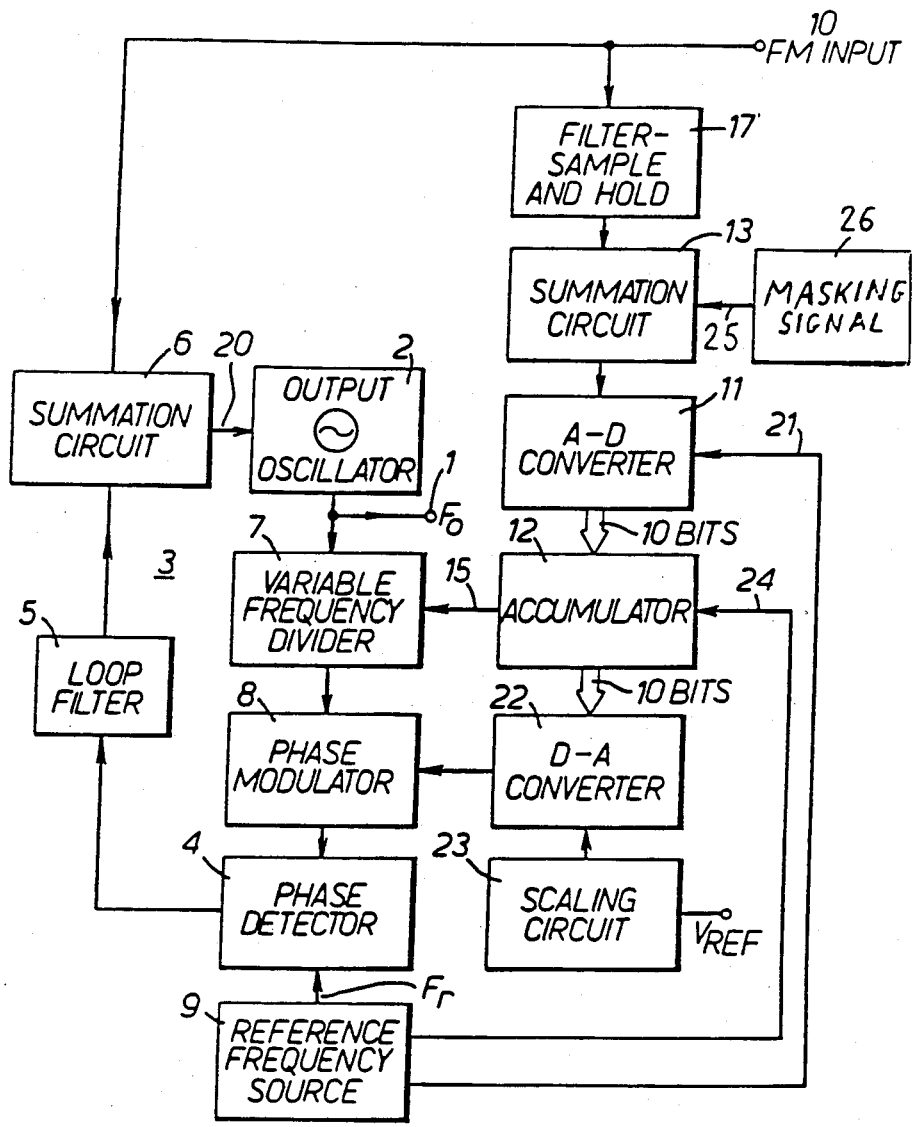
FIG. 1 shows a source of frequency modulation signals.

Referring to FIG. 1 there is shown therein a circuit which provides an output signal $F_o$ at an output terminal 1, the signal consisting of a frequency modulated signal having a predetermined mean frequency, and having frequency modulation of a controllable nature imposed upon it. The output signal is generated at a variable frequency oscillator 2, which forms part of a phase locked loop 3. The frequency of the oscillator 2 is determined by the voltage level of a control signal fed to it on lead 20. This control signal is derived partly from the output of a phase detector 4 via a loop filter 5 and partly from a frequency modulation control signal applied to an input terminal 10. The two components of the control signal are combined by a summation circuit 6 and applied to the frequency control input of the oscillator 2. In order to prevent the operation of the phase locked loop 3 from removing the effect of the wanted frequency modulation, the frequency characteristic of the phase locked loop is itself altered in steps with the value of the frequency modulation, by adjusting the division ratio of a variable frequency divider 7 connected to receive the output of the oscillator 2. The divided frequency output is fed from the divider 7 via a phase modulator 8 to one input of the phase detector 4, the other input of which receives an accurately known reference frequency from a very stable reference frequency source 9. The operation of the phase modulator 8 is described subsequently, but, in essence, its function is to remove undesirable phase noise which is introduced by the frequency divider 7 when its divisor value alters. The output of the phase modulator 8 presents an output frequency which should equal that of the reference source 9 when the loop 3 is correctly phase locked. The two signals applied to the phase detector 4 are compared, and if any discrepancy is found, a signal is generated and applied to the oscillator 2 via the loop filter 5 and the summation circuit 6, so as to adjust the frequency of the oscillator 2 in order to produce the required agreement.

Frequency dividers of the kind used in the phase locked loop have previously been used in the synthesis of required frequencies. As the divisor value of the divider can be altered during a division cycle, the technique is sometimes termed fractional-n-frequency synthesis, and an example of such a synthesiser is shown in British Patent No. 1560233. The merit of operating the frequency divider 7 in this way is that it permits the output frequency available at terminal 1 to be altered in increments which are smaller than the value of the reference frequency applied to the phase detector 4 by the reference frequency source 9. By altering the value of the divisor value of the frequency divider 7 in a rapid and controlled manner, in effect a desired fractional divisor value can readily be simulated.

A signal representative of the required frequency modulation is applied at input terminal 10, and is fed to the summation circuit 6 and also to an analogue-to-digital converter 11 via an input circuit 17 and a summation device 13 where it is combined with a frequency band limited noise signal from a source 26. The input device 17 comprises a low pass filter, and a sample and hold circuit connected in cascade. This device 17 ensures that any relatively high frequency components of the f.m. signal do not reach the converter 11, and cause aliasing signals to be generated.

The operation of the analogue-to-digital converter 11 is clocked via lead 21 under the action of the reference frequency from the source 9 and the resulting digital samples are fed into an accumulator 12 which is also clocked in a similar manner via lead 24. The clock signal may be derived from the output of the phase modulator 8 instead of from the source 9, as both frequencies are the same when the loop 3 is locked. The converter 11 can, if it is not sufficiently fast acting, be clocked at a lower frequency. The accumulator has a predetermined capacity and each time its contents overflow, a carry signal is provided over line 15 to the frequency divider 7 so as to temporarily alter the integer value N of its divisor. In this way the frequency characteristic of the phase locked loop 3 is altered in sympathy with the low frequency components of the frequency modulation signal received at terminal 10.

The alteration of the divisor value of the frequency divider 7 introduces phase jitter into its output, and this is corrected by means of the phase modulator 8 which provides a controlled variable delay to compensate, so that the divided pulses are applied to the phase detector 4 in a regular stream of equally spaced pulses. The necessary jitter correction signal is derived from a digital-to-analogue converter 22 which produces a signal whose magnitude varies in step with the "remainder" contents of the accumulator 12. The magnitude of this signal is scaled in inverse proportion to the value of the divisor N by the scaling circuit 23 which operates on a reference voltage $V_{Ref}$ as shown.

There is no effective lower frequency limit to the operation of this circuit, and a d.c. shift applied to terminal 10 will produce a corresponding modification of the phase locked loop, so that the output signal 1 will consist merely of a constant frequency shift having a value determined by the alteration in the d.c. level. The high frequency components of the modulation signal, which are above the frequency response of the loop filter 5 are applied directly to the oscillator 2 via the summation circuit 6, as they do not affect the operation of the phase locked loop 3. In order to compensate for small delays introduced by the operation of the converter 11, a broad band delay device of the order of 10 $\mu$S or the like can be inserted in the modulation input path of the summation circuit 6.

As described so far the invention gives acceptable d.c. coupled FM for some applications. However, when small changes of d.c. level are applied to the FM input at terminal 10, the output frequency $F_o$ will jump in discrete steps or levels because of the quantisation characteristics of the analogue-to-digital converter. The greater the resolution of the analogue-to-digital converter, the smaller the step size, but there is a practical limit to the resolution of the converter as high resolution converters are relatively slow in operation and in any event some residual quantisation noise will be present. This difficulty is overcome by injecting the additional signal into the summation circuit 13 from the source 26 via lead 25.

A low-level a.c. signal with an amplitude corresponding to a few digital bits peak-to-peak of analogue-to-digital resolution is added by the summation circuit 13 to the signal applied to the converter 11. It acts as a masking signal which suppresses quantisation noise originating at the converter 11. This results in the output code from the converter 11 varying with time. As the d.c. input level at terminal 10 is changed slightly, it affects the probability of each code being registered at any particular time and hence affects the "average" code output from the analogue-to-digital converter. This results in the oscillator output frequency changing in response, and gives continuous output frequency cover. Careful choice of the added signal can prevent generation of unwanted residual FM at the oscillator output.

The source 26 generates the masking signal which has a frequency well below that of the reference frequency of the source 9, and well above that of the cut-off frequency of the low pass loop filter 5. Typically the loop filter 5 has a pass characteristic extending upwards from d.c. (zero hertz) to between about 1 kHz and 10 kHz. The frequency of the source 9 is likely to be about 1 MHz to 10 MHz.

Although the masking signal on lead 25 may be a single spot frequency, it is preferred to use a signal having a predetermined spread of band limited frequencies. The frequency spread can be achieved by generating a pseudo-random sequence of pulses having the required characteristics, but in a preferred embodiment, the source 26 generates a wide frequency band "white" noise signal having a Gausian amplitude distribution which is centred on a frequency typically having a value between 50 kHz and 150 kHz, eg 100 kHz, and having a band limited frequency spread of the order of 10 kHz to 20 kHz. Thus, typically the noise signal has a frequency characteristic extending from 90 kHz to 110 kHz.

These frequencies are well above the pass band of the loop filter 5, and thus are attenuated thereby so that they do not affect the operation of the phase locked loop 3. Being well below the reference frequency, they do not interfere with the function of the phase detector 4.

The use of a wide band masking signal, as decribed, is more satisfactory in practice than a single spot frequency, as interfering coherent signals are less likely to result and accidental cancellation of the masking signal is unlikely. The masking signal enables quantisation effects to be suppressed, thereby permitting the oscillator 2 to generate a very high quality modulated output signal which is not degraded by this form of distortion. The purity of a modulated output signal can be of vital importance for many applications.

The circuit which has been described with reference to FIG. 1 is capable of providing frequency modulation, at frequencies extending down to zero (i.e. to d.c. levels) for carrier frequencies in the range $N \cdot f_r$ to $(N+1) f_r$ frequencies, where $f_r$ is the reference frequency supplied by the source 9 and N is the nominal divisor value of the divider 7, and is an integer. If operation is required over a greater carrier frequency range, this can be achieved by adopting the modification illustrated in FIG. 2.

Figure 2:
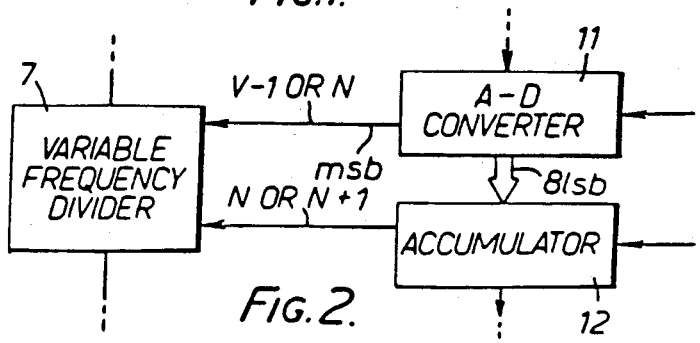
FIG. 2 shows a modification thereof.

With reference to FIG. 2, the analogue-to-digital converter 11 is a 10-bit device, and the 9 least significant bits are routed to the accumulator 12 as previously. However, the most significant bit (msb) is routed directly to the variable frequency divider 7. Whereas in FIG. 1 the output from the accumulator 12 was used to alter the frequency division value of the divider 7 between the integers N and N+1, the circuit shown in FIG. 2 enables the frequency divider 7 to adopt three different integer values N−1, N, and N+1. This extends the operating carrier frequency range to $(N-1) \cdot f_r$ to $(N+1) \cdot f_r$.

In FIG. 2 it is arranged that a frequency modulation input of 1 volt produces the digital code 111 111 1111 from the 10-bit analogue-to-digital converter 11, whereas an input of 0 volts produces a digital code of 100 000 0000 and an input of −1 volt produces the digital code 000 000 0000. The most significant bit acts to give an indication of whether the input level is positive or negative. If the input is negative, the divider 7 is set to divide by N−1 normally, and N when the accumulator overflows to produce a change in the most significant bit. If the input is positive, the divider 7 is set to divide by N normally and this changes momentarily to N+1 when the accumulator 12 overflows, i.e. produces a carry signal. In principle, this technique can be extended to control a variable frequency divider which can be set to a sequence of, say, N−2, N−1, N+1, N+2, so as to provide an even greater frequency control range.

Figure 3:
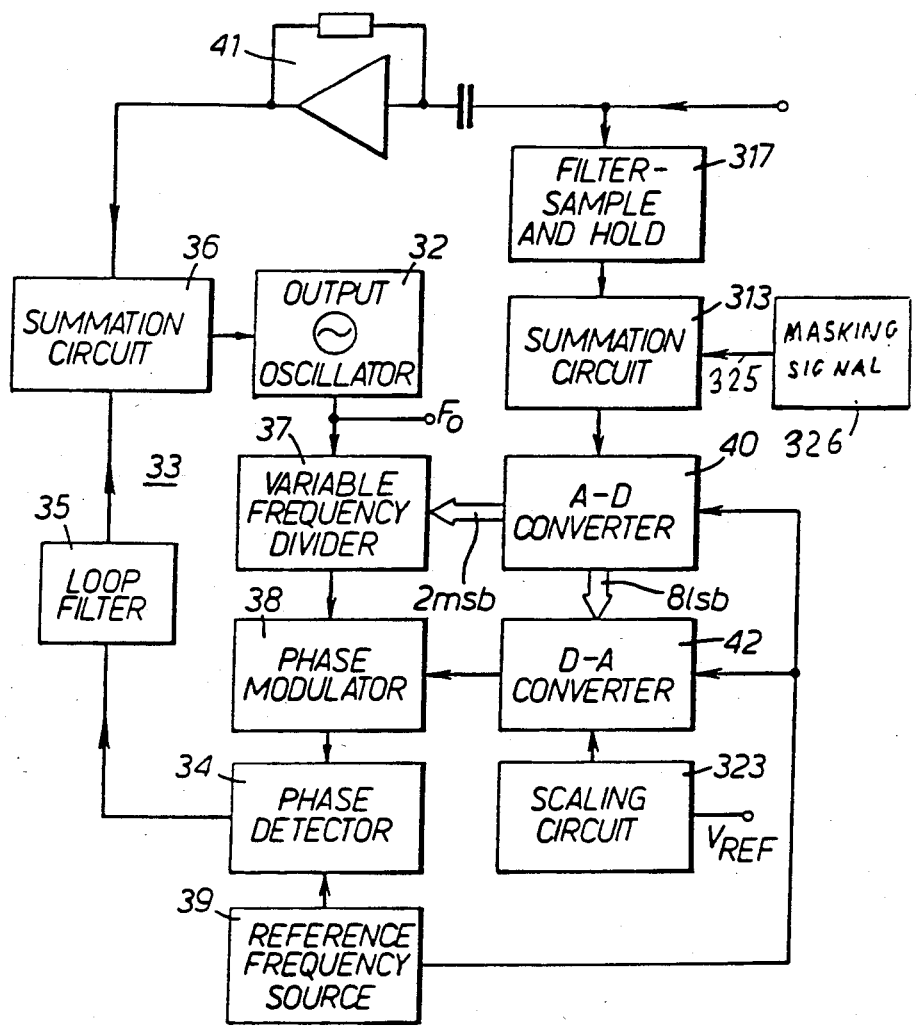
FIG. 3 shows a source of phase modulated signals.

FIG. 3 shows a further modification of the invention which is used to apply phase modulation to an output signal. The circuit is somewhat similar to that shown in FIG. 1, in that an oscillator 32 forms part of a phase lock loop 33, and a phase detector 34, a loop filter 35 and summation device 36 are provided. However, the frequency divider 37 is controlled not from an accumulator, but directly by a 10-bit analogue-to-digital converter 40. The remainder of the circuit is very similar to FIG. 1, and equivalent items bear the same reference numeral prefixed by the numeral 3. In addition, the differentiator 41 is provided to modify the input signal which is applied to the summation device 36.

Assuming that a phase deviation of $4\pi$ radians is required; the analogue-to-digital converter 40 has 10 bits of resolution; and uses typical codes as follows:-

| Phase Deviation | | | | | | | | | | |
|---|---|---|---|---|---|---|---|---|---|---|
| −4π | 0 | 0 | 0 | 0 | 0 | 0 | 0 | 0 | 0 | 0 |
| −2π | 0 | 1 | 0 | 0 | 0 | 0 | 0 | 0 | 0 | 0 |
| 0 | 1 | 0 | 0 | 0 | 0 | 0 | 0 | 0 | 0 | 0 |
| 2π | 1 | 1 | 0 | 0 | 0 | 0 | 0 | 0 | 0 | 0 |
| —continued | | | | | | | | | | |
| Phase Deviation | | | | | | | | | | |
| 4π | 1 | 1 | 1 | 1 | 1 | 1 | 1 | 1 | 1 | 1 |

As before, a digital-to-analogue converter 42 is used to cancel out undesirable phase jitter and its output signal is used to modify the phase characteristics of a phase modulator 38. The converter 42 can provide up to $2\pi$ radians of phase deviation directly, and is therefore driven by the 8 least significant bits (lsb) from the analogue-to-digital converter 40. If the two most significant bits are 1 0 (i.e. the input signal is positive and has a value of less than $2\pi$ radians) the frequency divider 37 is set by the most significant bits from the analogue-to-digital converter 40 to divide by the value (N+1) for one phase detector period and is then returned to the value N. If the most significant bits change from 1 1 to 1 0 the frequency divider is set to divide by the value (N−1) for one cycle and is then a digital phase shift of $2\pi$ radians to the phase locked loop. Fractional deviations of $2\pi$ radians are applied to the codes 0 0, 0 1 and 1 0 in order to extend the phase modulation capability to provide the complete range required. In conventional manner, the phase shift is filtered by the action of the phase locked loop 33. Broadband phase modulation is obtained by applying the output of the differentiator circuit 41 to the control of the oscillator 32 via the summation device 36 in order to convert the FM signal applied to the oscillator into phase modulation.

Although in FIGS. 1 and 3, specific circuit arrangements are illustrated for controlling and altering the integer value of the variable frequency divider to simulate a fractional value, alternative techniques can be used; for example, the technique described in our co-pending Patent Application No. 8313617. This technique repetitively applies rapid equal and opposite alterations to the devisor value so as to make it unnecessary to provide the phase modulator 8 or 38 or its equivalent for the purpose of removing phase jitter.

It should be noted that the examples described in conjunction with the drawings are not fractional-N frequency synthesisers in the sence that the term is used in the previously noted British Patent No. 1560233. Thus, if the frequency modulation input voltage at terminal 10 has a content value of zero volts, the output frequency $F_o$ at terminal 1 is an integer (N) multiple of the reference frequency $F_r$. The phase locked loop 3 can, of course, be modified so that it can in addition provide a conventional fractional-N synthesised mean output frequency. Thus, in FIG. 1, the accumulator 12 would require a second input port, or the analogue-to-digital converter 11 output could be added in a full adder with the fractional instruction before being connected to the accumulator 12.

I claim:

1. A modulation signal source including a phase locked loop having a variable frequency oscillator; a variable frequency divider and a dual input phase detector, the frequency of said oscillator being dependent upon the value of a control signal derived from said phase detector; a source of reference frequency signals, the phase detector being operative to compare the frequency of a signal received from said oscillator via said divider with the frequency of a signal derived from the source of reference frequency signals; means for receiving a modulation signal and for utilising it to adjust said control signal; digital means responsive to said modulation signal to vary the divisor value of said frequency divider; and means for also feeding a masking signal to said digital means so as to reduce the effect of digital quantisation noise on the frequency characteristic of the phase locked loop.

2. A modulation signal source including a phase locked loop having a variable frequency oscillator; a variable frequency divider a dual input phase detector, and a low pass filter, the frequency of said oscillator being dependent upon the value of a control signal derived from said phase detector and fed to it via said low pass filter; a source of reference frequency signals, the phase detector being operative to compare the frequency of a signal received from said oscillator via said divider with the frequency of a signal derived from the source of reference frequency signals; means for receiving a modulation signal and for utilising it to adjust said control signal; analogue-to-digital conversion means responsive to said modulation signal to vary the divisor value of said frequency divider; and means for producing at said conversion means a masking signal having a frequency below that of said reference frequency signals and above that of the cut-off value of said low pass filter, whereby the output signal of said oscillator is modulated in accordance with said modulation signal.

3. A source as claimed in claim 2 and wherein means are provided for arranging that the high frequency components of the modulation signal are utilised for adjusting said control signal, and the low frequency components are utilised for varying said divisor value.

4. A source as claimed in claim 2 and wherein said modulation signal is applied via a low pass filter to said analogue-to-digital conversion means, from which a signal is derived to vary said divisor value.

5. A source as claimed in claim 4, and wherein said modulation signal carries information indicative of a required frequency modulation, and the output of said analogue-to-digital conversion means is fed to an accumulator where successive outputs are cumulatively summed, the divisor value being varied when the cumulative sum reaches or exceeds a predetermined threshold value.

6. A source as claimed in claim 5 and wherein the magnitude of the most significant bit of the output of said analogue-to-digital conversion means is utilised to vary said divisor value.

7. A source as claimed in claim 5 and wherein the analogue-to-digital conversion means and the accumulator are clocked at said reference frequency.

8. A source as claimed in claim 4, and wherein said modulation signal carries information indicative of a required phase modulation, and the magnitude of a predetermined number (including one) of the most significant bits of the output of said analogue-to-digital conversion means is utilised to vary said divisor value.

9. A source as claimed in claim 8, and wherein the analogue-to-digital conversion means is clocked at said reference frequency.

10. A source as claimed in claim 8 and wherein said modulation signal is fed via a differentiating circuit to said means which utilise it to adjust said control signal.

11. A source as claimed in claim 2 and wherein said masking signal is a wide band noise signal having a predetermined frequency band width lying between the reference frequency and the cut-off frequency of said low pass filter.

12. A source as claimed in claim 11 and wherein said wideband noise signal has a Gausian amplitude distribution centred on a frequency of between 50 kHz and 150 kHz.

13. A source as claimed in claim 12 and wherein the predetermined frequency band is about 1O kHz to 20 kHz wide.

* * * * *